United States Patent
Arno

(10) Patent No.: US 9,231,627 B2
(45) Date of Patent: Jan. 5, 2016

(54) ADAPTIVE ISO-GAIN PRE-DISTORTION FOR AN RF POWER AMPLIFIER OPERATING IN ENVELOPE TRACKING

(71) Applicant: STMicroelectronics International N.V., Amsterdam (NL)

(72) Inventor: Patrik Arno, Sassenage (FR)

(73) Assignee: STMicroelectronics International N.V., Amsterdam (NL)

(*) Notice: Subject to any disclaimer, the term of this patent is extended or adjusted under 35 U.S.C. 154(b) by 80 days.

(21) Appl. No.: 14/072,898

(22) Filed: Nov. 6, 2013

(65) Prior Publication Data

US 2015/0126141 A1 May 7, 2015

(51) Int. Cl.
*H04B 1/04* (2006.01)

(52) U.S. Cl.
CPC ...... *H04B 1/0475* (2013.01); *H04B 2001/0425* (2013.01)

(58) Field of Classification Search
CPC .......... H02J 7/0065; H02M 2001/0003; H03F 1/0238; H03F 1/0227
USPC .......... 455/126–127.5, 108, 114.3, 455/115.1–115.4
See application file for complete search history.

(56) References Cited

U.S. PATENT DOCUMENTS

| | | | | |
|---|---|---|---|---|
| 8,975,959 | B2* | 3/2015 | Khlat | H03G 1/04 330/136 |
| 2008/0285542 | A1* | 11/2008 | Jachner | H04L 12/581 370/351 |
| 2009/0045872 | A1* | 2/2009 | Kenington | H04B 1/0475 330/127 |
| 2009/0061863 | A1* | 3/2009 | Huggett | H04L 63/101 455/434 |
| 2013/0024142 | A1 | 1/2013 | Folkmann et al. | |
| 2013/0229228 | A1* | 9/2013 | Drogi | H03G 3/004 330/127 |
| 2013/0257531 | A1* | 10/2013 | Tanio | H03F 1/0211 330/149 |
| 2014/0266423 | A1* | 9/2014 | Drogi | H03F 3/189 330/75 |

OTHER PUBLICATIONS

Gerard Wimpenny. "Understand and characterize envelope-tracking power amplifiers." www.edn.com, May 10, 2012, pp. 41-47.

* cited by examiner

*Primary Examiner* — Edward Urban
*Assistant Examiner* — Rui Hu
(74) *Attorney, Agent, or Firm* — Gardere Wynne Sewell LLP

(57) ABSTRACT

The output of a Radio Frequency (RF) Power Amplifier (PA) is sampled and down-converted, and the amplitude envelope of the baseband feedback signal is extracted. This is compared to the envelope of a transmission signal, and the envelope tracking modulation of the RF PA supply voltage $V_{CC}$ is adaptively pre-distorted to achieve a constant ISO-Gain (and phase) in the RF PA. In particular, a nonlinear function is interpolated from a finite number gain values calculated from the feedback and transmission signals. This nonlinear function is then used to pre-distort the transmission signal envelope, resulting in a constant gain at the RF PA over a wide range of supply voltage $V_{CC}$ values. Since the gains are calculated from a feedback signal, the pre-distortion may be recalculated at event triggers, such as an RF frequency change. Furthermore, the method improves nonlinearity in the entire transmitter chain, not just the RF PA.

12 Claims, 16 Drawing Sheets

| $x_k$ | $y_k$ | $Df_k$ | $D^2f_k$ | $D^3f_k$ | ... |
|---|---|---|---|---|---|
| $x_0$ | $y_0$ | $Df_0 = \frac{y_1 - y_0}{x_1 - x_0}$ | $D^2f_0 = \frac{Df_1 - Df_0}{x_2 - x_0}$ | $D^3f_0 = \frac{D^2f_1 - D^2f_0}{x_3 - x_0}$ | ... |
| $x_1$ | $y_1$ | $Df_1 = \frac{y_2 - y_1}{x_2 - x_1}$ | $D^2f_1 = \frac{Df_2 - Df_1}{x_3 - x_1}$ | ... | |
| $x_2$ | $y_2$ | $Df_2 = \frac{y_3 - y_2}{x_3 - x_2}$ | ... | | |
| $x_3$ | $y_3$ | ... | | | |

$a_0, a_1, ..., a_n$ COEFFICIENTS

*FIG. 9*

ADAPTIVE ISO-GAIN PRE-DISTORTION FOR AN RF POWER AMPLIFIER OPERATING IN ENVELOPE TRACKING

FIELD OF INVENTION

The present invention relates generally to RF transmitters, and in particular to an adaptive ISO-Gain pre-distortion for an RF power amplifier operating in envelope tracking mode.

BACKGROUND

Mobile electronic communication devices—including cellular telephones, pagers, smartphones, remote monitoring and reporting devices, and the like—have dramatically proliferated with the advance of the state of the art in wireless communication networks. Many such devices are powered by one or more batteries, which provide a Direct Current (DC) voltage. One challenge to powering electronic communication devices from batteries is that the battery does not output a stable DC voltage over its useful life (or discharge cycle), but rather the DC voltage decreases until the battery is replaced or recharged. Also, many electronic communication devices include circuits that operate at different voltages. For example, the Radio Frequency (RF) circuits of a device may require power supplied at a different DC voltage than digital processing circuits.

A DC-DC converter is an electrical circuit typically employed to convert an unpredictable battery voltage to one or more continuous, regulated, predetermined DC voltage levels, and thus to provide stable operating power to electronic circuits. Numerous types of DC-DC converters are known in the art. The term "buck" converter is used to describe a DC-DC converter that outputs a lower voltage than the DC source (such as a battery); a "boost" converter, also called a step-up, is one that outputs a higher voltage than its DC input. Both boost and buck converters may be implemented as switched mode power supplies (SMPS), in which energy is transferred from a source, such as battery, to a storage component, such as an inductor or capacitor, at a high frequency through transistor switches.

Supplying power to an RF power amplifier (PA) of an electronic communication device is particularly challenging. The efficiency of an RF PA varies with the amplitude of the transmission signal to be amplified. Maximum efficiency is achieved at full power, and drops rapidly as the transmission signal amplitude decreases, due to transistor losses accounting for a higher percentage of the total power consumed. The loss of efficiency may be compensated by a technique known as "envelope tracking," in which the output of a DC-DC converter, and hence the voltage supplied to the PA, is not constant, but is modulated to follow the amplitude modulation of the transmission signal. In this manner, at any given moment, the power supplied to the RF PA depends on the amplitude of the signal being amplified. Such modulation of the RF PA power supply can dramatically improve power consumption efficiency.

FIG. 1 depicts the relevant RF output portion of an electronic communication device 10. A battery 12 provides a battery voltage $V_{BAT}$ to an efficient, wide-bandwidth envelope-tracking power supply 14 that modulates the supply voltage of the RF PA 16. The RF PA 16 outputs an amplified RF signal for transmission from the device 10 on one or more antenna 18. The modulated voltage $V_{CC}(t)$ output by the dynamic power supply 14 should be capable of tracking a rapidly varying reference voltage. As such, the power supply 14 must meet certain bandwidth specifications. The required bandwidth depends on the specifications of the network(s) in which the RF PA 16 is used. For example, the required bandwidth exceeds 1 MHz for EDGE systems (8PSK modulation), and exceeds 30 MHz for LTE20 (Long Term Evolution).

The design of transmitters 10 employing envelope tracking power supplies 14 for RF PAs 16 is challenging, and requires the use of more sophisticated characterization techniques than is the case for designing traditional, fixed supply power amplifiers. The fundamental output characteristics of an RF PA 16 with an envelope tracking power supply—power, efficiency, gain, and phase—depend on two control inputs: RF input signal power and the supply voltage $V_{CC}$.

A typical envelope tracking system dynamically adjusts the supply voltage $V_{CC}$ to track the RF input signal envelope at high instantaneous power. In this case, the PA 16 operates with high efficiency in compression. The instantaneous supply voltage $V_{CC}(t)$ primarily determines the PA 16 output characteristics. Unfortunately, this supply voltage modulation introduces an additional source of distortion that is due to the variations of PA 16 gain and/or phase as a function of the supply voltage $V_{CC}$. FIG. 2A depicts variations in gain (AM-AM), and FIG. 2B depicts variations in phase AM-PM) with supply voltage $V_{CC}$ variations. In a conventional PA, supplied by a constant voltage, these variations are only linked to the variation of the RF input signal voltage.

FIG. 3A depicts the time-domain variations of the voltage $V_{CC}$ supplied to a PA 16 by an envelope tracing power supply 14, and FIG. 3B depicts the corresponding time-domain variations in the gain of the PA 16. These waveforms clearly show the dependency of the gain on supply voltage modulation. For example, large negative deviations, or drops, in supply voltage $V_{CC}$ correspond to very large decreases in gain. Moreover, this dependency is a nonlinear one, being significantly more pronounced as the supply voltage $V_{CC}$ is reduced. FIG. 4 depicts the PA 16 gain as a function of the supply voltage $V_{CC}$, where again it is evident that low excursions of supply voltage $V_{CC}$ correspond to dramatic drops in the small signal gain of the RF PA 16. This modulation of the PA 16 gain impairs linearity of the PA 16.

In general, the transfer function for an amplified RF signal is $$V_{OUT}(V_{CC}, V_{IN}) = G_{PA}(V_{CC}, V_{IN}) \cdot V_{IN} \quad (1)$$

where $V_{IN}$ is the magnitude of the RF PA 16 input signal, $V_{OUT}(V_{IN}, V_{CC})$ is the magnitude of the output signal, $V_{CC}$ is the PA 16 instantaneous voltage from power supply 14, and finally $G_{PA}(V_{IN}, V_{CC})$ is the gain of the PA. The gain $G_{PA}$, and hence the output voltage $V_{OUT}$, is a nonlinear function of $V_{IN}$ and $V_{CC}$. Ideally, the gain should be constant.

The nonlinear gain $G_{PA}$ can be approximated by a two-dimensional polynomial.

$$G_{PA}(V_{CC}, V_{IN}) = b_0 + b_1 V_{CC} + b_2 V_{CC}^2 + \ldots + b_{\beta-1} V_{CC}^{\beta-1} + b_\beta V_{CC}^\beta$$

with:

$$\begin{aligned}
b_0 &= c_{0_1} + c_{1_1} \cdot V_{IN} + \ldots + c_{\alpha-1_1} \cdot V_{IN}^{\alpha-1} + c_{\alpha_1} \cdot V_{IN}^\alpha \\
b_1 &= c_{0_2} + c_{1_2} \cdot V_{IN} + \ldots + c_{\alpha-1_2} \cdot V_{IN}^{\alpha-1} + c_{\alpha_2} \cdot V_{IN}^\alpha \\
&\ldots \\
b_{\beta-1} &= c_{0_{\beta-1}} \cdot V_{IN} + \ldots + c_{\alpha-1_{\beta-1}} \cdot V_{IN}^{\alpha-1} + c_{\alpha_{\beta-1}} \cdot V_{IN}^\alpha \\
b_\beta &= c_{0_\beta} + c_{1_\beta} \cdot V_{IN} + \ldots + c_{\alpha-1_\beta} \cdot V_{IN}^{\alpha-1} + c_{\alpha_\beta} \cdot V_{IN}^\alpha
\end{aligned} \quad (2)$$

FIGS. 5A and 5B depict how laboratory measurements (circles) of PA 16 gain vs. supply voltage $V_{CC}$ and RF transmission signal voltage, respectively, can be interpolated using the 2-D polynomial (continuous lines). Note that the phase shift of the PA 16 could similarly be written this way and interpolated by a 2-D polynomial.

The term "ISO-Gain" is used herein as a generic, descriptive term to denote a constant gain ($G_{ISO}$) in an RF PA 16, which does not change in response to variations in $V_{CC}$ and $V_{IN}$. From equation (1), the gain can be written as:

$$G_{PA}(V_{CC}, V_{IN}) = \frac{V_{OUT}(V_{CC}, V_{IN})}{V_{IN}} = \frac{V_{OUT}(V_{CC}, V_{IN})}{V_{CC}} \cdot \frac{V_{CC}}{V_{IN}} \quad (3)$$

In envelope tracking operation the voltage $V_{CC}$ (from the voltage supply 14) is a linear replica of the envelope of an RF input signal multiplied by a constant $\alpha$. As a result:

$$G_{PA}(V_{CC}, V_{IN}) = \frac{V_{OUT}(V_{CC}, V_{IN})}{V_{CC}} \cdot \alpha \quad (4)$$

In order to obtain a constant gain $G_{ISO}$ over variations in both $V_{CC}$ and $V_{IN}$, the following condition must be met:

$$G_{PA}(V_{CC}, V_{IN}) = G_{ISO} \quad (5)$$

so, $$G_{ISO} = \frac{V_{OUT}(V_{CC}, V_{IN})}{V_{CC\_pred}} \cdot \alpha. \quad (6)$$

This condition can be fulfilled by modifying the shape of $V_{CC}$ through a particular pre-distortion gain that depends on both $V_{CC}$ and $V_{IN}$:

$$V_{CC\_pred}(V_{CC}, V_{IN}) = V_{CC} \cdot \text{Gain}_{pred}(V_{CC}, V_{IN}). \quad (7)$$

Substituting equation (7) into equation (6) yields an expression of the required pre-distortion gain:

$$\text{Gain}_{pred}(V_{CC}, V_{IN}) = \frac{\alpha}{G_{ISO}} \cdot \frac{V_{OUT}(V_{CC}, V_{IN})}{V_{CC}} \quad (8)$$

FIG. 6 depicts the operation of ISO-Gain pre-distortion in the case where $V_{CC}$ is constant and $V_{IN}$ (or $P_{IN}$) varies. The nonlinear gain applied to the supply voltage $V_{CC}$ is depicted in the lower curve, whereas the PA 16 gains with and without ISO-Gain pre-distortion are depicted in the upper two curves. The upper curve clearly shows that ISO-Gain operation allows maintaining the gain of the PA 16 relatively constant for a wide range of $V_{IN}$ (or $P_{IN}$).

In practice, pre-distortion such as that depicted in FIG. 6 relies on testing and calibrations performed at chip fabrication. Pre-distortion parameters are calculated, and stored in large look-up tables (LUT). During operation, pre-distortion perturbations are retrieved from the LUTs and applied to the power supply 14. Accuracy is proportional to the size of the LUT; however, accuracy is limited because the necessary computation time is also proportional to the LUT size. Additionally, because all known envelope tracking RF PA power supply pre-distortion is "open-loop" and uses factory-generated values, the pre-distortion applied cannot be recalculated over the life of the circuit, such as to account for shifts in RF frequency, output power, temperature, component aging, and the like.

The Background section of this document is provided to place embodiments of the present invention in technological and operational context, to assist those of skill in the art in understanding their scope and utility. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

According to one or more embodiments described and claimed herein, an adaptive pre-distortion system and method does not rely on voluminous parameters, stored in large LUTs, generated from factory calibrations. Rather, the output of the RF PA is sampled and down-converted, and the amplitude envelope of the baseband feedback signal is extracted. This is compared to the envelope of the transmission signal, and the envelope tracking modulation of the RF PA supply voltage $V_{CC}$ is adaptively pre-distorted to achieve a constant ISO-Gain in the RF PA. In particular, a nonlinear function is interpolated from a finite number gain values calculated from the feedback and transmission signals. This nonlinear function is then used to pre-distort the transmission signal envelope, resulting in a constant gain at the RF PA over a wide range of supply voltage $V_{CC}$ values. Since the gains are calculated from a feedback signal, the pre-distortion may be recalculated at event triggers, such as an RF frequency change. Furthermore, the method improves nonlinearity in the entire transmitter chain, not just the RF PA.

One embodiment relates to an adaptive method of pre-distorting an envelope tracking modulation of supply voltage for a RF PA. The amplitude envelope of a complex baseband transmission signal is calculating, and the complex baseband transmission signal is frequency up-converted to RF. A supply voltage, output by a dynamic power supply to a RF PA, is modulated in response to the amplitude envelope of the baseband transmission signal. The RF transmission signal is amplified by the RF PA receiving the modulated supply voltage. An RF feedback signal is sampled at the RF PA output, frequency down-converted to baseband, and an amplitude envelope of the baseband feedback signal is extracted. The amplitude envelope of the baseband feedback signal is compared with the amplitude envelope of the baseband transmission signal, and the modulation of the supply voltage is pre-distorted in response to the comparison so as to achieve a constant gain in the RF PA.

Another embodiment relates to an RF transmitter. The transmitter includes a signal generator operative to generate a complex baseband transmission signal; frequency up-converting mixers operative to up-convert the baseband transmission signal to RF; an RF PA operative to amplify the RF transmission signal; a dynamic power supply operative to provide a supply voltage to the RF PA that is modulated to track an amplitude envelope of the baseband transmission signal; a feedback loop operative to sample an RF feedback signal at the RF PA output and frequency down-convert the RF feedback signal to baseband; and a pre-distortion circuit operative to calculate the gain of the RF PA based on the baseband feedback signal and the baseband transmission signal, and further operative to control the power supply to pre-distort the modulated supply voltage so as to achieve a constant gain in the RF PA.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

FIG. 9 is a table depicting the calculation of coefficients to a nonlinear function.

DETAILED DESCRIPTION

It should be understood at the outset that although illustrative implementations of one or more embodiments of the present disclosure are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Figure 1:
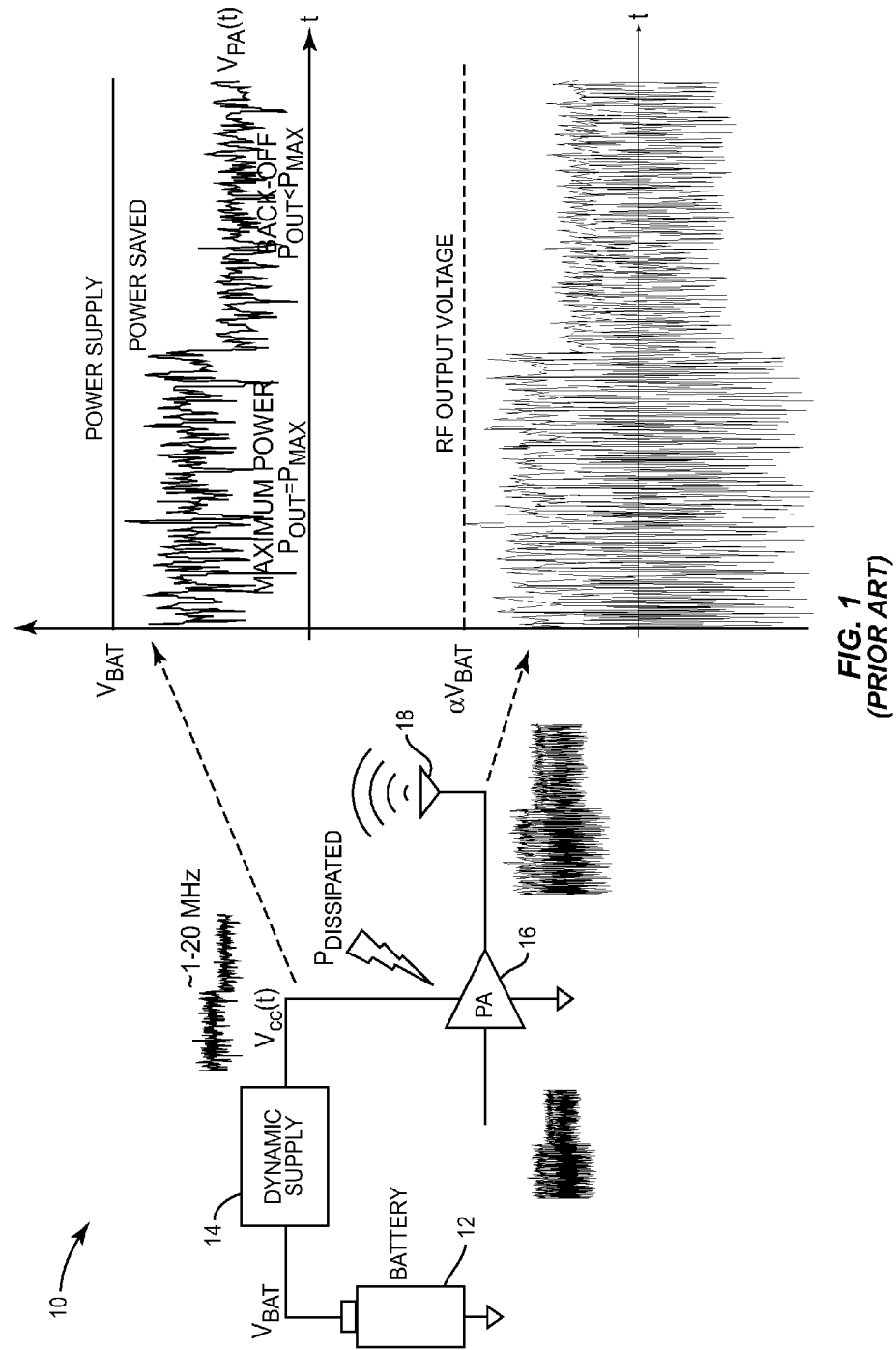
FIG. 1 is a functional block diagram of a conventional transmitter output, depicting envelope tracking.
Figure 2A:
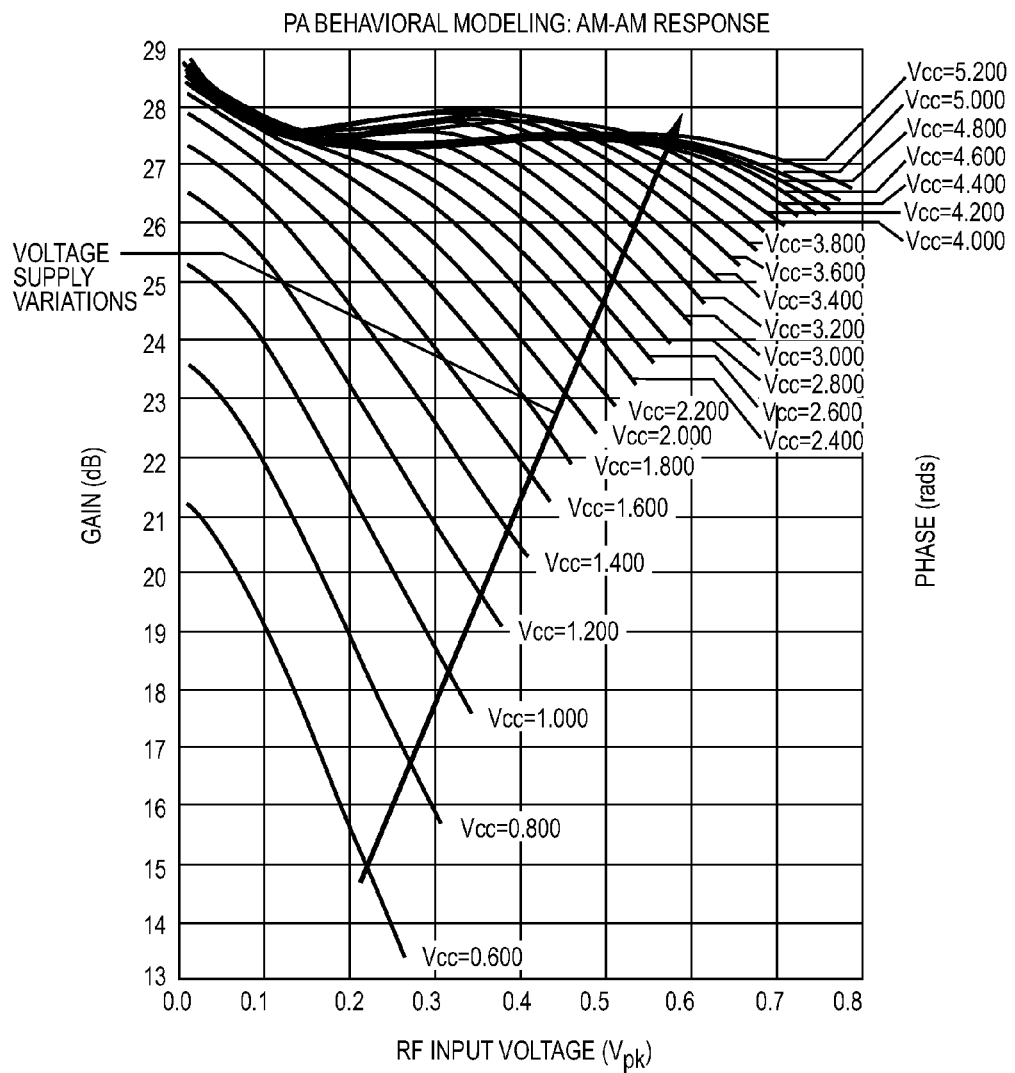
FIG. 2A is a graph depicting variations in gain (AM-AM) with supply voltage $V_{CC}$ variations in a conventional envelope tracking PA.
Figure 2B:
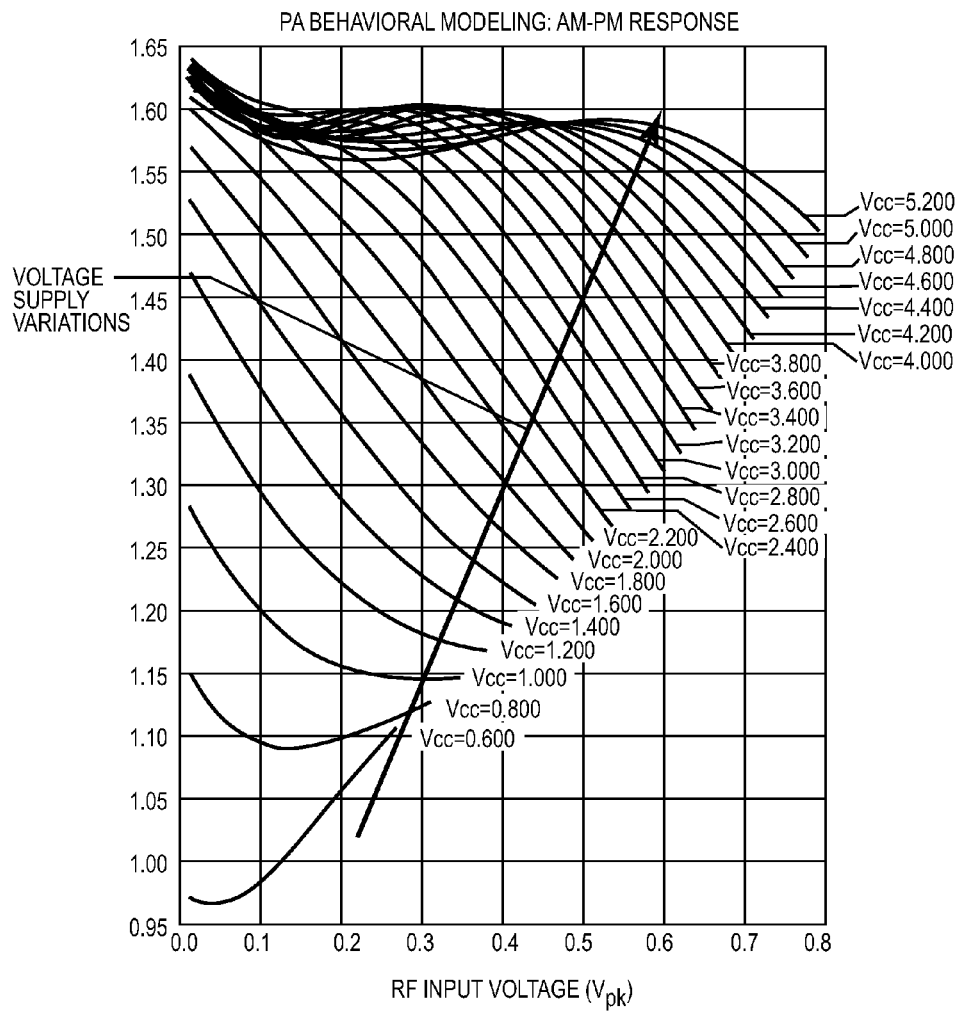
FIG. 2B is a graph depicting variations in phase AM-PM) with supply voltage $V_{CC}$ variations in a conventional envelope tracking PA.
Figure 3A:
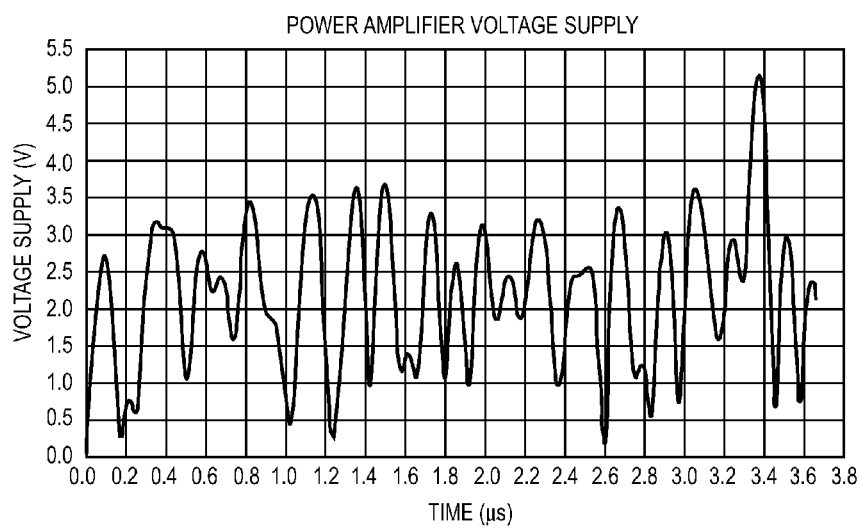
FIG. 3A is a graph depicting time-domain variations of the voltage $V_{CC}$ supplied to a PA by a conventional envelope tracking power supply.
Figure 3B:
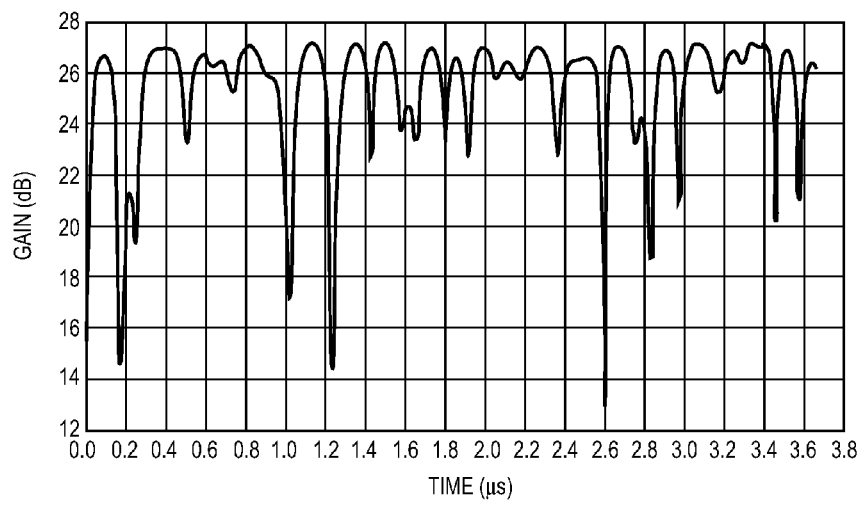
FIG. 3B is a graph depicting the time-domain variations in the gain of a PA receiving a conventional envelope tracking supply voltage.
Figure 4:
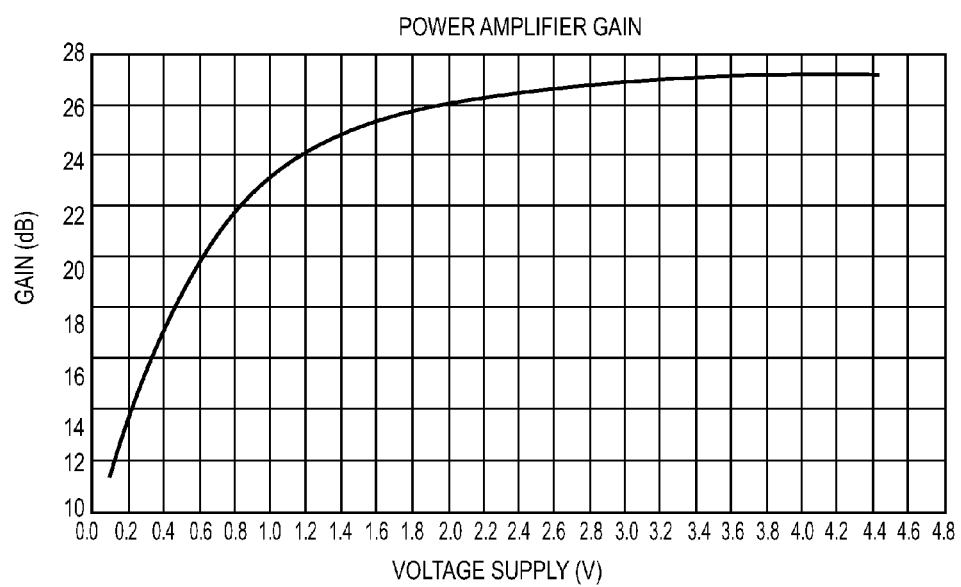
FIG. 4 is a graph depicting the PA gain as a function of the supply voltage $V_{CC}$ for a conventional envelope tracking power supply
Figure 5A:
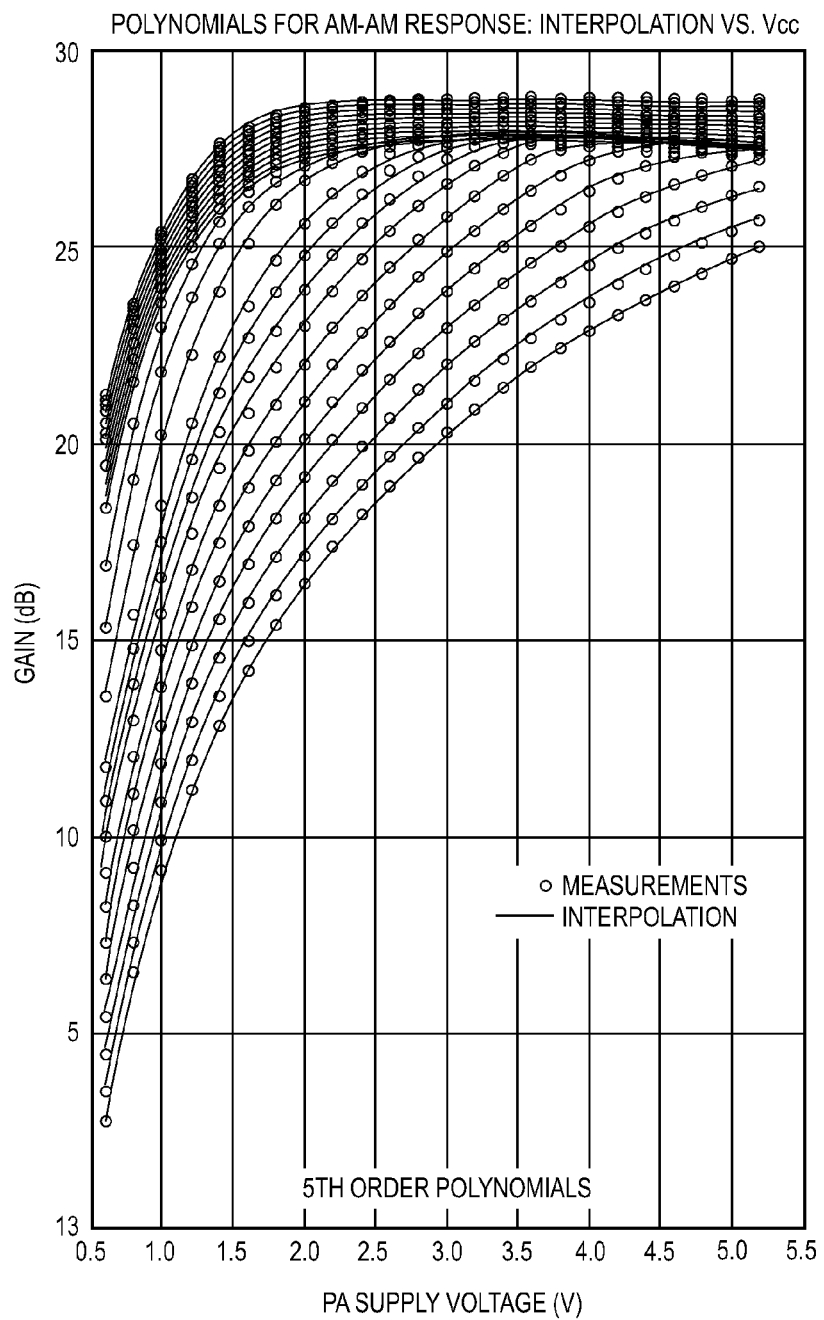
FIG. 5A is a graph depicting how laboratory measurements (circles) of PA gain vs. supply voltage $V_{CC}$ can be interpolated using the 2-D polynomial (continuous lines).
Figure 5B:
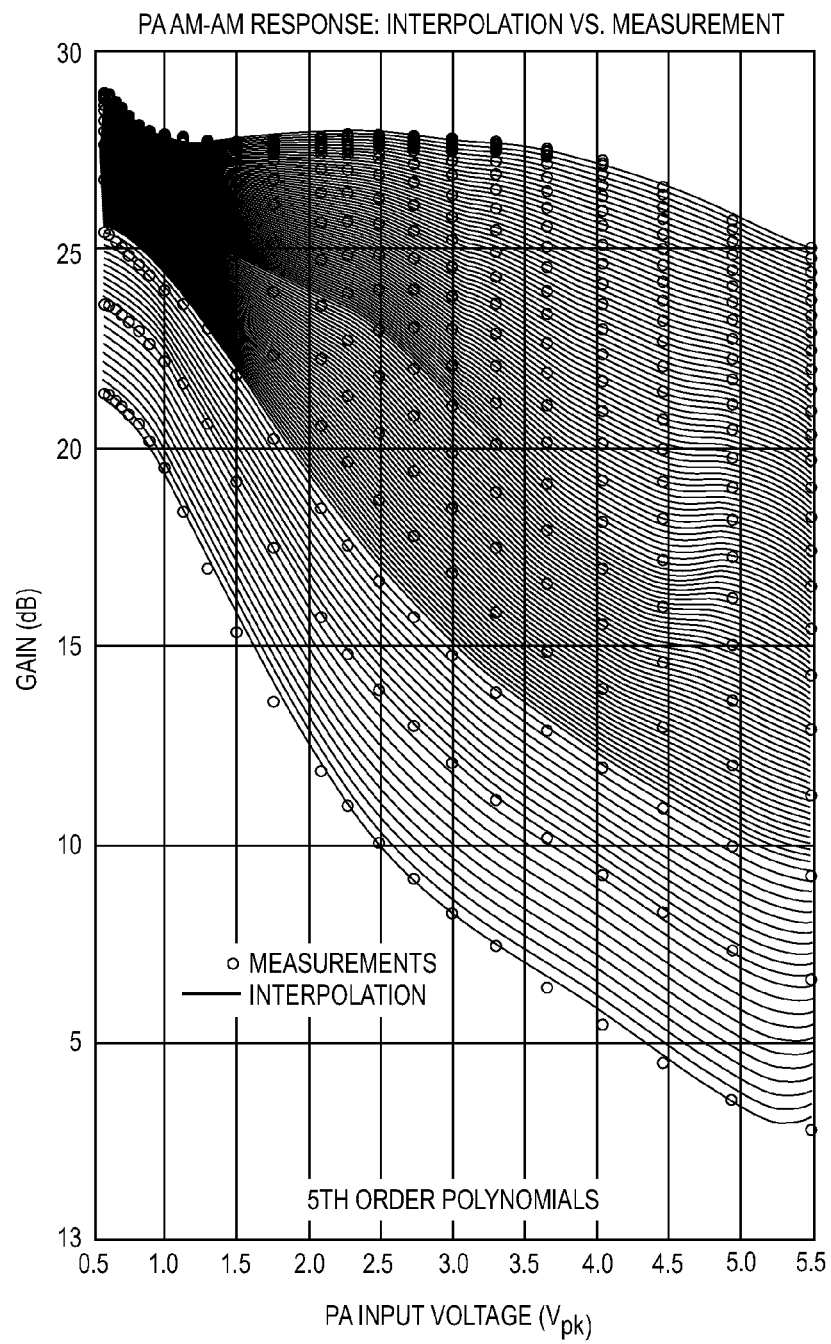
FIG. 5B is a graph depicting how laboratory measurements of PA gain (circles) vs. RF PA input signal can be interpolated using the 2-D polynomial (continuous lines).
Figure 6:
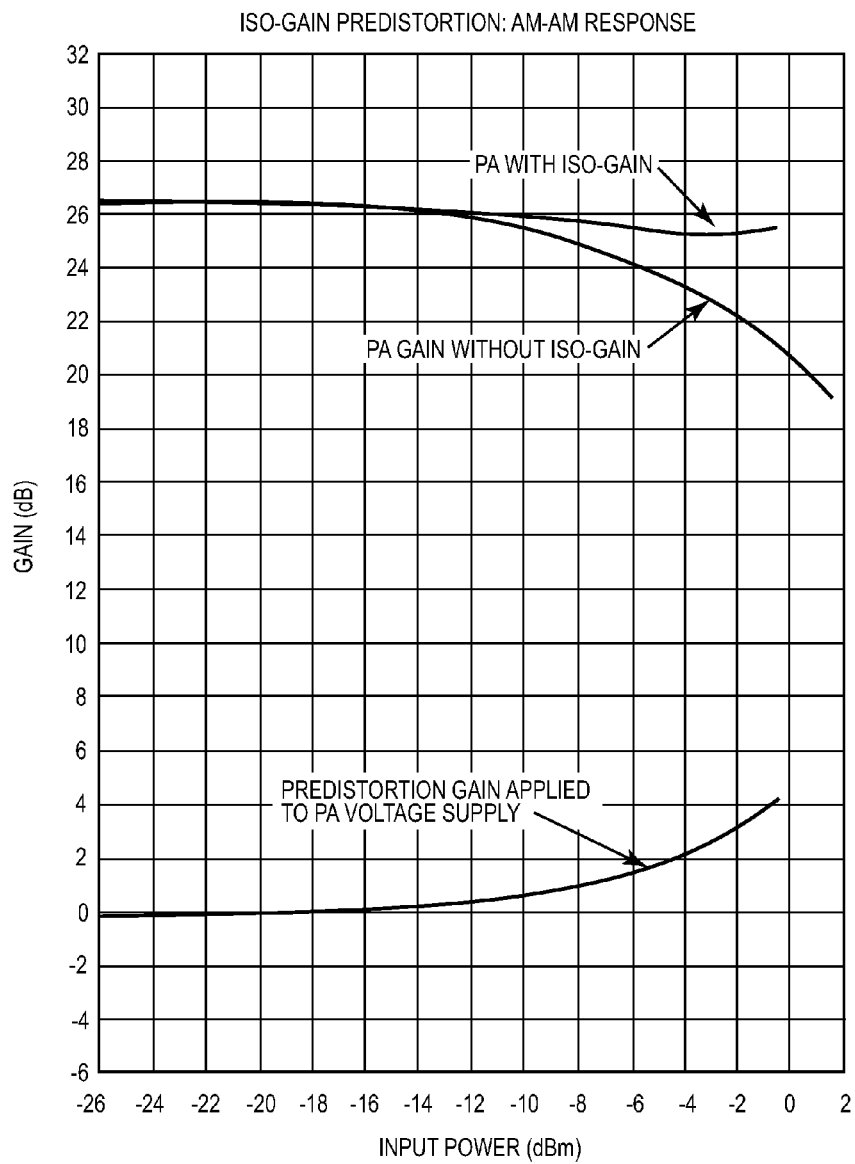
FIG. 6 depicts the operation of conventional ISO-Gain pre-distortion in the case where $V_{CC}$ is constant and $V_{IN}$ varies.
Figure 7:
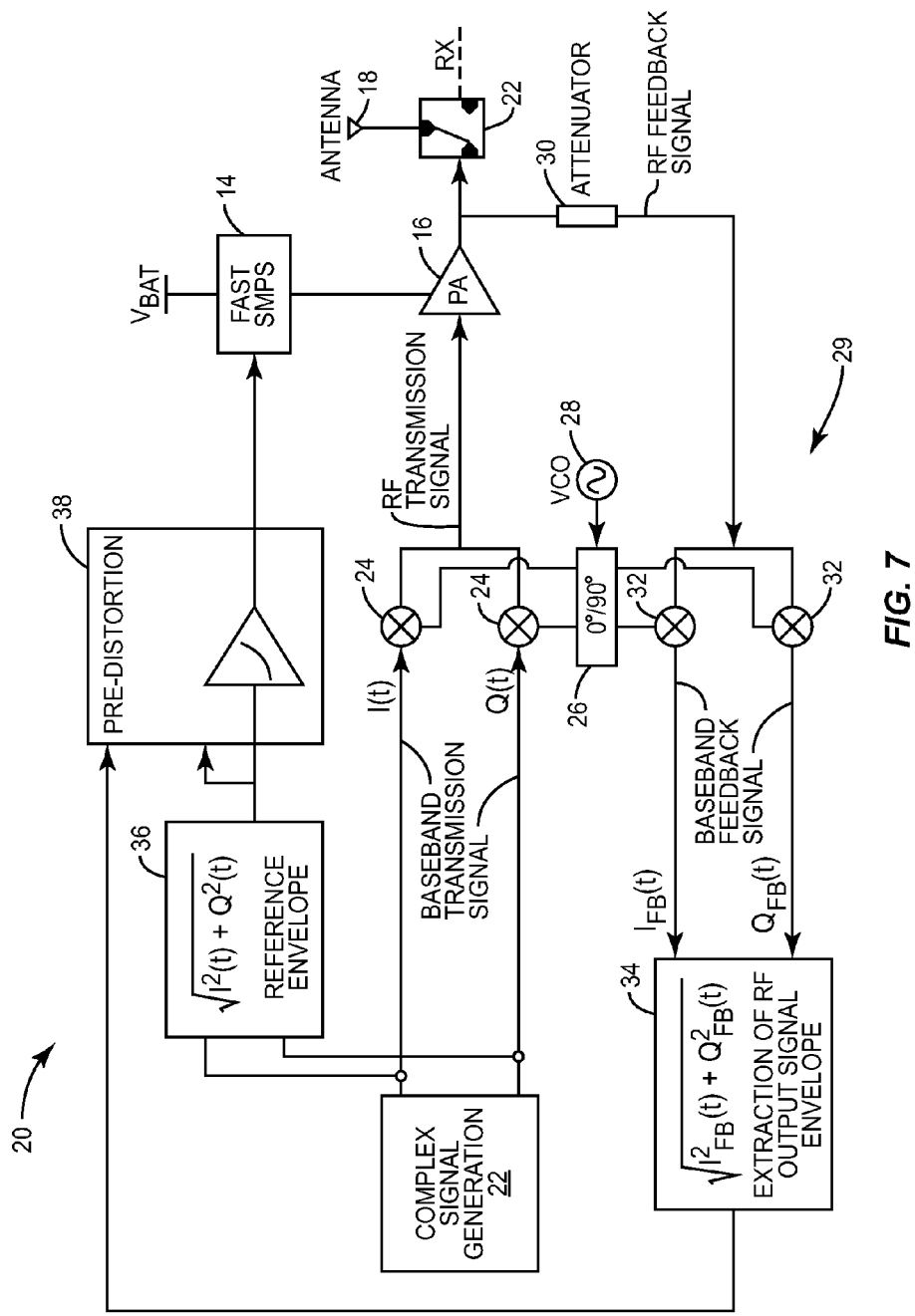
FIG. 7 a functional block diagram of portions of an RF transmitter employing an envelope tracking power supply with adaptive, feedback-based pre-distortion to achieve ISO-Gain for the PA, according to embodiments of the present invention.

FIG. 7 depicts a functional block diagram of relevant portions of an RF transmitter 20 employing an envelope tracking power supply 14 with adaptive, feedback-based pre-distortion to achieve ISO-Gain for the PA 16. The basic transmission blocks of the transmitter 20 are as depicted in FIG. 1: a battery 12 provides a slowly-varying DC voltage to a fast switched mode power supply 14, which modulates the supply voltage $V_{CC}$ provided to a power amplifier (PA) 16 based on the amplitude envelope of an RF transmission signal (the PA 16 input). The PA 16 outputs an amplified RF output signal, through a duplexer 22, to an antenna 18 for transmission. As known in the art, the duplexer 22 isolates the transmitter 20 from a receiver circuit (not shown), and alternately connects the antenna 18 to one of the transmitter 20 and receiver.

The transmitter 20 also includes conventional elements, including a complex signal generator 22, such as a processor or Digital Signal Processor (DSP) generating baseband, time-varying In-band (I) and Quadrature (Q) transmission signal components. These transmission signal components are frequency up-converted to RF in mixers 24, by mixing with high frequency clock signals, phase-separated by 90° in a phase shifter 26. The high frequency clock input to the phase shifter 26 is generated by a source 28, such as a tunable voltage controlled oscillator (VCO), crystal oscillator, phase locked loop, or the like.

According to embodiments of the present invention, the transmitter 20 includes a feedback path 29 and pre-distortion circuit 38 operative to pre-distort an envelope tracking voltage $V_{CC}$ output by the power supply 14 to the RF PA 16, so as to achieve a constant ISO-Gain $G_{ISO}$ at the RF PA 16. The feedback path 29 includes an attenuator 30 that taps a fraction of the power of the RF output signal, generating an RF feedback signal. The RF feedback signal is frequency down-converted by mixers 32, generating baseband $I_{FB}$ and $Q_{FB}$ components of a feedback signal. An extraction circuit 34 extracts the amplitude envelope of the baseband feedback signal, which is provided to the pre-distortion circuit 38.

The amplitude envelope of the baseband transmission signal is calculated by an envelope circuit 36 from the real and imaginary parts of the complex transmission signal, and is also provided to the pre-distortion circuit 38. The envelope circuit 36 may comprise part of the processor 22. The pre-distortion circuit 38 processes the baseband feedback signal envelope and that of the baseband transmission signal, and outputs control signals to the dynamic power supply 14 that modulate $V_{CC}$ to achieve ISO-Gain in the PA 16. In one embodiment, the pre-distortion circuit 38 multiplies the baseband transmission signal amplitude envelope by a nonlinear function, where the parameters of the nonlinear function are determined by calculation of the actual gain of the RF PA 16

(e.g., the feedback signal envelope divided by the transmission signal envelope). The pre-distortion circuit 38 may comprise a state machine, processor, DSP, or other computational circuit. The pre-distortion circuit 38 may additionally be implemented as software executed on another processor, such as the signal generator 22.

In this manner, embodiments of the present invention achieve a constant ISO-Gain in the RF PA 16, by using feedback of the RF PA output to adaptively pre-distort the envelope tracking supply voltage $V_{CC}$ provided by power supply 14. Such adaptive ISO-Gain pre-distortion can compensate distortions of the entire transmitter 20, allowing the linearity constraints on DACs (not shown), mixers 24, and the RF PA 16 to be lowered. Any distortion generated by the feedback loop 29 is not compensated by the pre-distortion algorithm. The adaptive, feedback-based ISO-Gain pre-distortion may additionally compensate non-linearity in the fast switched mode power supply 14. Furthermore, the dynamic control provided by adaptive pre-distortion does not depend on factory calibration results, and hence can account for operational changes, such as changes in RF frequency, output power, temperature, component aging, and the like. Additionally, large LUTs are not required to store voluminous calibration data, as in the case of open-loop pre-distortion methods, and consequently high accuracy is achieved with low latency and low computational complexity.

In one embodiment, the pre-distortion circuit 38 multiplies the reference amplitude envelope of the baseband transmission signal by a nonlinear function to generate control signals for the power supply 14. In one embodiment, the nonlinear function is approximated by a polynomial. The coefficients of the polynomial are calculated (and dynamically updated) using information about the envelope of the baseband feedback signal obtained from the feedback path 29. In this embodiment, the transmitter 20 operates in closed-loop mode only during the calculation or update of the polynomial coefficients, which are stored in small LUTs. During operation, the transmitter 20 operates in open-loop mode, using the calculated/updated polynomial coefficients. At trigger events, such as the expiration of a periodic timer, or operational events such as a transmission frequency change, the transmitter 20 again goes into closed-loop mode to update the polynomial coefficients based on the amplitude envelope of the baseband feedback signal.

In one embodiment, an algorithm for employing a polynomial-based nonlinear function in the pre-distortion circuit 38 includes three steps. First, a measurement, or Learning, Sequence is performed. This is followed by an Interpolation Sequence. Finally, a Computation Sequence is performed. The first two of these—Learning and Interpolation—are performed only when an update of the polynomial coefficients is needed.

The Learning Sequence is performed when the transmitter 20 is operational, i.e., transmitting a signal, such as a voice call. The complex RF signal output by the PA 16 is sampled, down-converted to baseband, and converted to I and Q format, in the feedback loop 29. A conversion is then performed in extraction circuit 34 to obtain the amplitude envelope of the baseband feedback signal:

$$ENV_{FB}(t) = \sqrt{I_{FB}(t)^2 + Q_{FB}(t)^2} \quad (9)$$

Among all measured samples, only N+1 values are selected and stored, for a polynomial of order N. These points are chosen as a function of $V_{CC}$, which is an image of the envelope of the baseband feedback signal:

$$V_{CC}(t) = \alpha \sqrt{I^2(t) + Q^2(t)} \quad (10)$$

Figure 8:
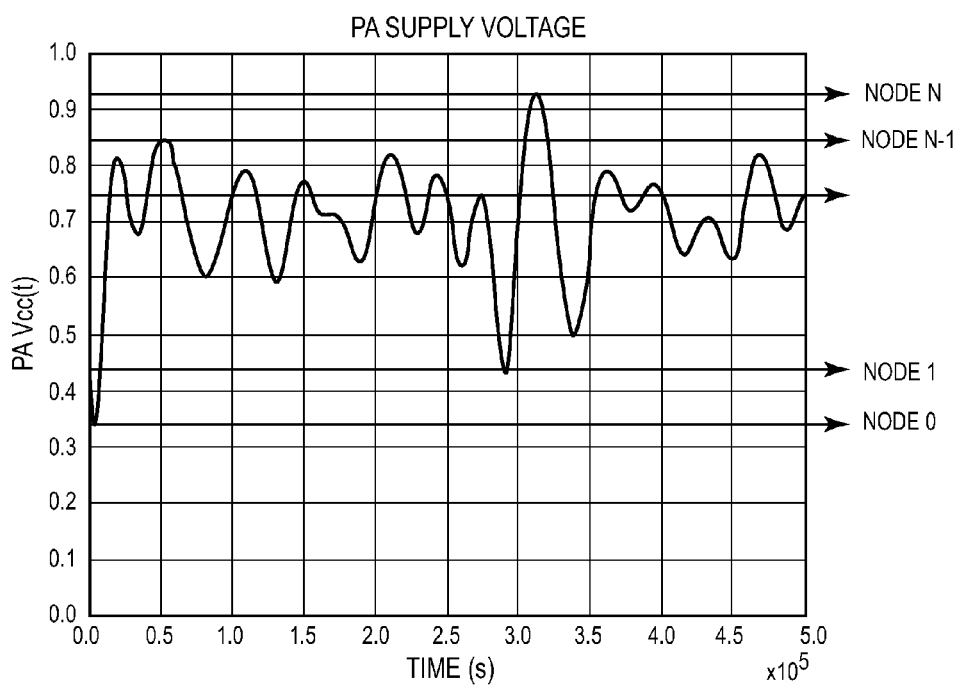
FIG. 8 is a graph depicting a waveform of $V_{CC}(t)$ as a function of time, with a representative set of interpolation nodes.

The samples selection is performed according to the following condition:

$$\text{If } V_{CC}(t) = V_{CC,k} \Rightarrow \text{store}[ENV_{FB,k}] \text{ with } 0 \leq k \leq N \quad (11)$$

where N is the order of the polynomial used to interpolate the pre-distortion function and $V_{CC,k}$ are the interpolation points or "nodes." FIG. 8 depicts a waveform of $V_{CC}(t)$ as a function of time, with a representative set of interpolation nodes. The interpolation nodes may be equally spaced, and calculated using a simple equation. Alternatively, the interpolation nodes may be selected by other methods. One example of an interpolation node selection approach that minimizes interpolation error is to select Chebyshev nodes. In this approach, $$V_{CC,k} = \min(V_{CC}(t)) + j \cdot \frac{\max(V_{CC}(t)) - \min(V_{CC}(t))}{N} \text{ with} \quad (12)$$

$$0 \leq j \leq N$$

where $\min(V_{CC}(t))$ and $\max(V_{CC}(t))$ are the minimum and maximum values of power supply modulation, respectively. These values must be detected, or may be provided by the digital baseband signal generator 22.

The Learning Sequence thus records the baseband feedback signal envelope $ENV_{FB}$ and corresponding PA 16 supply voltage $V_{CC}$ for each of a plurality of interpolation nodes. In one embodiment, the Learning Sequence is preferably performed several times in order to filter the samples through a mean value computation. In one embodiment, the mean values over $V_{CC,k}$ and $ENV_{FB,k}$ are calculated, preferably over multiple measurement iterations.

In the Interpolation Sequence, the stored samples are used for interpolating the pre-distortion function. That is, a nonlinear function is generated that is a "best fit" curve to the sampled ($V_{CC,k}$, $ENV_{FB,k}$) data points. In one embodiment, the nonlinear function is modeled as a polynomial. In one embodiment, the interpolation is performed using Newton's algorithm. Newton's algorithm is a known mathematical function, which has the advantage that only multiply and sum mathematical operations are required for implementation.

The gain values to be interpolated are determined directly from the stored, sampled ($V_{CC,k}$, $ENV_{FB,k}$) data points:

$$G_{pred,k} = \frac{ENV_{FB,k}}{V_{CC,k}} \text{ with } 0 \leq k \leq N \quad (13)$$

This pre-distortion gain must be normalized in order to neglect any constant gain (or attenuation) that could have been applied to the feedback signal by the feedback loop 29:

$$G_{pred,k} = \frac{ENV_{FB,k}}{V_{CC,k}} \cdot \frac{\overline{V_{CC,k}}}{\overline{ENV_{FB,k}}} \text{ with } 0 \leq k \leq N \quad (14)$$

where, in one embodiment, the average values were measured during the Learning Sequence.

After the gain values are calculated, a small table of (N+1)×2 is filled with the interpolation inputs:

$$\begin{pmatrix} V_{CC,0} & G_{pred,0} \\ \vdots & \vdots \\ V_{CC,N-1} & G_{pred,N-1} \\ V_{CC,N} & G_{pred,N} \end{pmatrix}$$

Starting from these values, the gain pre-distortion function is interpolated as a function of $V_{CC}$. In one embodiment, the polynomial form of Newton's formula is utilized:

$$G_{pred}(V_{CC}(t)) = \frac{\alpha}{G_{ISO}}[g_0 + g_1 \cdot (V_{CC}(t) - V_{CC,0}) + \quad (15)$$
$$g_2 \cdot (V_{CC}(t) - V_{CC,0}) \cdot (V_{CC}(t) - V_{CC,1}) + \ldots +$$
$$g_N \cdot (V_{CC}(t) - V_{CC,0}) \cdot (V_{CC}(t) - V_{CC,1}) \ldots (V_{CC}(t) - V_{CC,N-1})]$$

One advantage of Newton's formula is that an $N^{th}$-degree polynomial, matching the N+1 data points $\{(x_0, y_0), (x_1, y_1), \ldots, (x_N, y_N)\}$ can be recursively obtained as the sum of the $(N-1)^{th}$-degree Newton polynomial matching N data points $\{(x_0, y_0), (x_1, y_1), \ldots, (x_{N-1}, y_{N-1})\}$ and one additional term. See, for example, Won Y. Yang, et al., "Applied Numerical Methods Using Matlab," Wiley Interscience, 2005, the disclosure of which is incorporated herein by reference in its entirety. Thus, $$p_N(x) = a_0 + a_1 \cdot (x-x_0) + a_2 \cdot (x-x_0) \cdot (x-x_1) + \ldots$$

$$p_N(x) = p_{N-1} + a_N \cdot (x-x_0) \cdot (x-x_1) \ldots (x-x_{N-1}) \text{ with}$$
$$p_0(x) = a_0 = y_0 \quad (16)$$

The polynomial coefficients $a_0, a_1, \ldots, a_n$ can be calculated as follows:

$$a_0 = y_0 \quad (17)$$

$$a_1 = \frac{y_1 - a_0}{x_1 - x_0} = \frac{y_1 - y_0}{x_1 - x_0} \equiv Df_0$$

$$a_2 = \frac{\frac{y_2 - y_1}{x_2 - x_1} - \frac{y_1 - y_0}{x_1 - x_0}}{x_2 - x_0} = \frac{Df_1 - Df_0}{x_2 - x_0} \equiv D^2 f_0$$

On the other hand, the general formula for the calculation of the $N^{th}$ coefficient $a_n$ of a Newton polynomial function is:

$$a_N = \frac{D^{N-1} f_1 - D^{N-1} f_0}{x_N - x_0} \equiv D^N f_0 \quad (18)$$

This is the "divided difference," which can be obtained recursively from the second row of the table depicted in FIG. 9. The coefficients calculation is quite simple and requires only few subtractions and divisions to implement. Furthermore, this calculation is performed only once during the Interpolation Sequence, to generate the nonlinear function from the sampled $(V_{CC,k}, ENV_{FB,k})$ data points.

At the completion of the Interpolation Sequence, (N+1) values—representing the Newton's polynomial coefficients—replace the measured samples in the table of values stored during the Learning Sequence.

$$\begin{pmatrix} V_{CC,0} & G_{pred,0} \\ \vdots & \vdots \\ V_{CC,N-1} & G_{pred,N-1} \\ V_{CC,N} & G_{pred,N} \end{pmatrix} \Rightarrow \begin{pmatrix} V_{CC,0} & g_0 \\ \vdots & \vdots \\ V_{CC,N-1} & g_{N-1} \\ V_{CC,N} & g_N \end{pmatrix}$$

In the Computation Sequence, the polynomial coefficients $g_n$ are used to dynamically calculate the pre-distortion gain to be applied to $V_{CC}$, using equation (15). That is, the pre-distortion circuit 38 multiplies the baseband transmission signal amplitude envelope provided by reference circuit 36 "on the fly" by equation (15), using the stored values of $(V_{CC,n}, g_n)$. This calculation, which requires only multiplication and summing functions, is performed in open-loop mode, using the stored $(V_{CC,n}, g_n)$ values.

Figure 10:
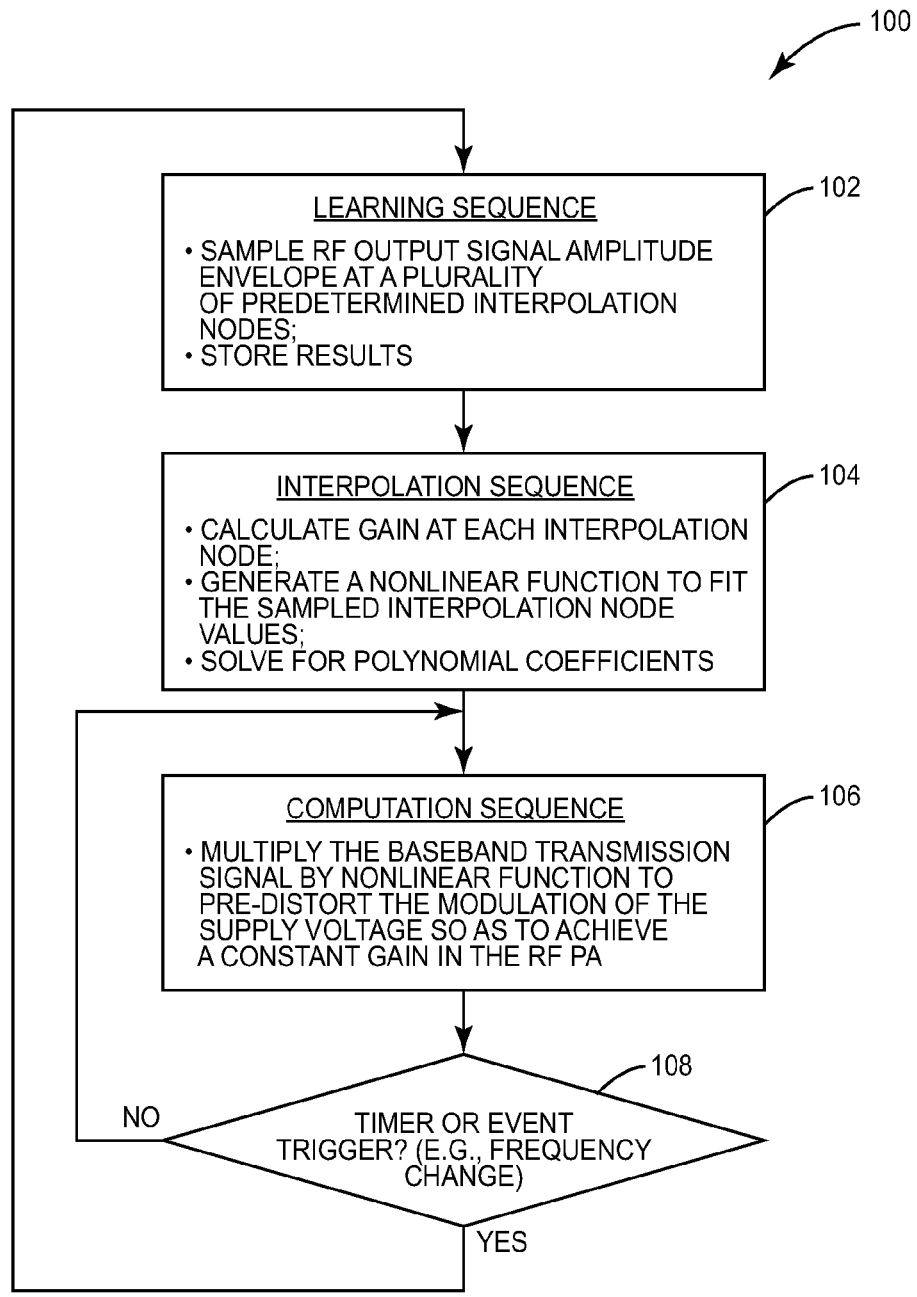
FIG. 10 is a flow diagram of an adaptive method of pre-distorting an envelope tracking modulation of supply voltage for a RF PA.

At event triggers, such as periodically or at transmitter 20 power or frequency changes, the algorithm is repeated. As depicted in FIG. 10, in a Learning Sequence (block 102), new $V_{CC}$ and $ENV_{FB}$ values are measured from the feedback path 29, for N+1 defined interpolation nodes, and these values are stored. In an Interpolation Sequence (block 104), the gain of the RF PA 16 is calculated, and a nonlinear function reflecting the actual gain ($ENV_{FB}/V_{CC}$) is constructed from these feedback data points, such as by using Newton's formula to construct a polynomial. The parameters defining the nonlinear function, such as the coefficients of a Newton's polynomial, are calculated and stored. Subsequently, in an ongoing Computation Sequence (block 106), the amplitude envelope of a baseband transmission signal is multiplied by the nonlinear function to control the power supply 14 to modulate a supply voltage $V_{CC}(t)$ provided to the RF PA 16. The pre-distorted, envelope-tracking, modulated supply voltage $V_{CC}(t)$ dynamically matches the power requirements of the RF PA 12 for the RF transmission signal being amplified, while maintaining a constant ISO-Gain. If there is no event trigger, such as expiration of a periodic timer, RF frequency change, or the like (block 108), then the Computation Sequence (block 106) is repeated—that is, it is an ongoing process. If an event trigger does occur (block 108), then the entire method 100 is repeated, with new parameters for the nonlinear function calculated from the feedback path 29.

The ISO-Gain pre-distortion algorithm described herein was simulated recursively, and the gain linearity improvement tested at each iteration. The simulations used a $5^{th}$-order polynomial, and a LTE 10 MHz full RB. The benefit of ISO-Gain is evaluated taking into account PA 16 instantaneous gain; PA 16 instantaneous phase shifting; E_UTRA Adjacent Channels Power Ratio (ACPR); and UTRA ACPRs.

Figure 11A:
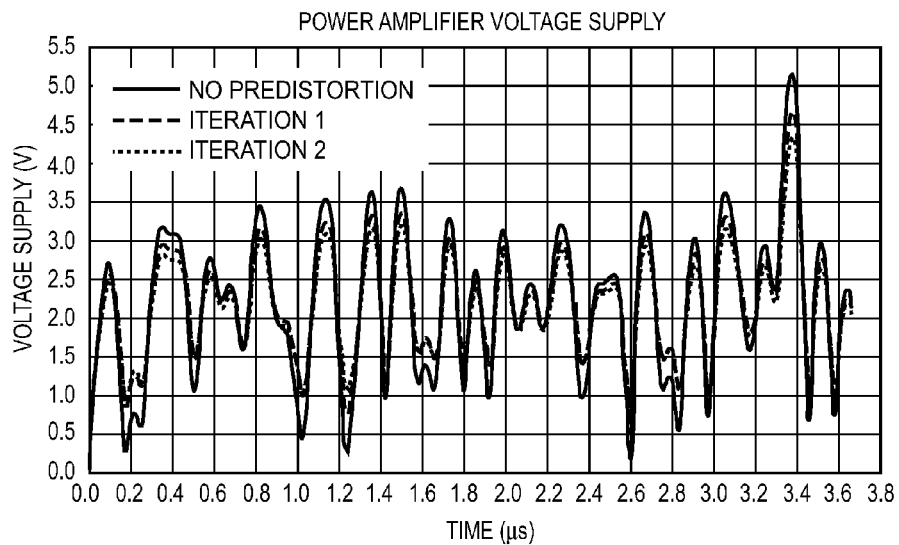
FIG. 11A is a graph depicting the evolution of the RF PA supply voltage $V_{CC}(t)$ over several iterations of the adaptive ISO-Gain method of FIG. 10.
Figure 11B:
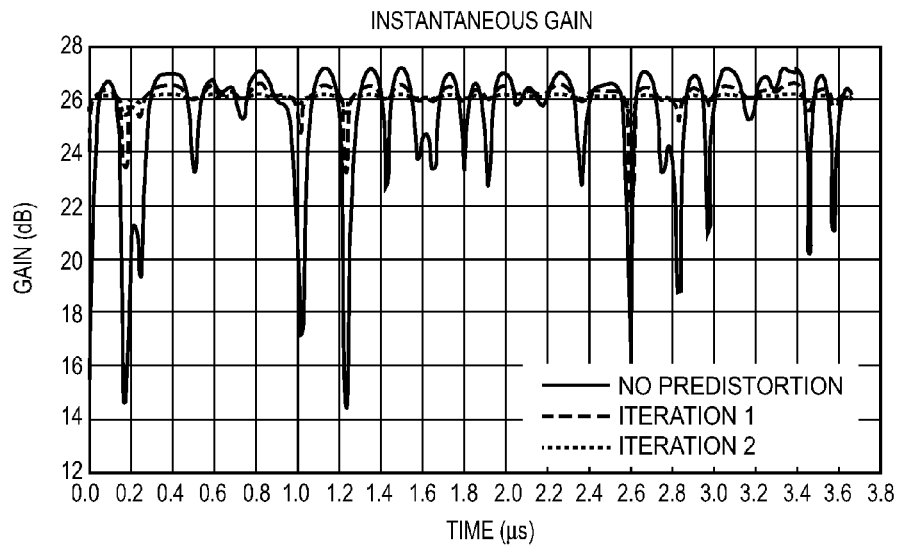
FIG. 11B is a graph depicting the evolution of the RF PA gain over several iterations of the adaptive ISO-Gain method of FIG. 10.

FIG. 11A depicts the evolution of the RF PA 16 supply voltage $V_{CC}(t)$, and FIG. 11B depicts the evolution of the RF PA 16 instantaneous gain, after each iteration of the adaptive ISO-Gain algorithm. FIG. 11A clearly depicts that as the number of iterations of the algorithm increase, the RF PA 16 gain becomes increasingly constant versus time. As noted above, it is the decreases in $V_{CC}$ that cause the greatest dips in PA 16 gain; multiple iterations of the adaptive pre-distortion algorithm of embodiments of the present invention dramatically reduce these downward excursions in the gain. Furthermore, FIG. 11B shows that an additional benefit of the adaptive pre-distortion algorithm disclosed herein is that dynamics of $V_{CC}$ variations versus time is reduced. This reduction in dynamics improves the accuracy and performance of the power supply 14.

Figure 12:
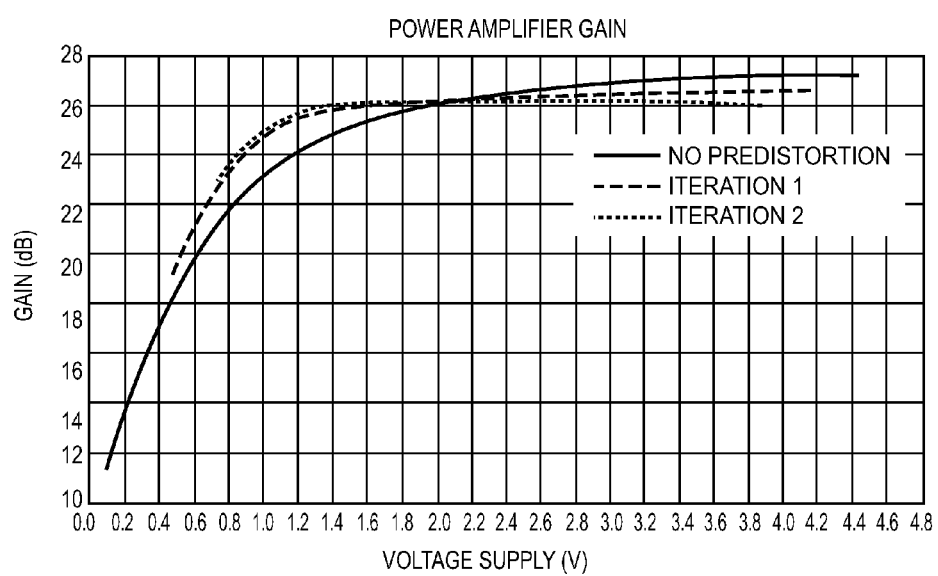
FIG. 12 is a graph depicting RF PA gain vs. supply voltage $V_{CC}(t)$ over several iterations of the adaptive ISO-Gain method of FIG. 10.
Figure 13:
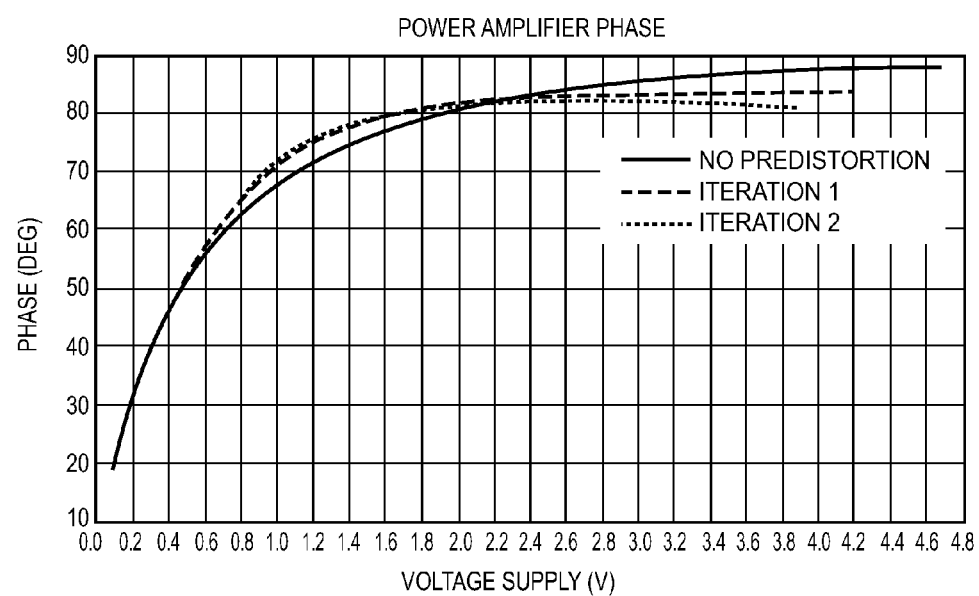
FIG. 13 is a graph depicting RF PA phase vs. supply voltage $V_{CC}(t)$ over several iterations of the adaptive ISO-Gain method of FIG. 10.

FIGS. 12 and 13 depicts RF PA 16 gain and phases shift variations, respectively, as a function of instantaneous variations in the supply voltage $V_{CC}$. After each iteration, both gain and phase shift become more and more constant, even though the supply voltage $V_{CC}$ varies during the time.

Figure 14:
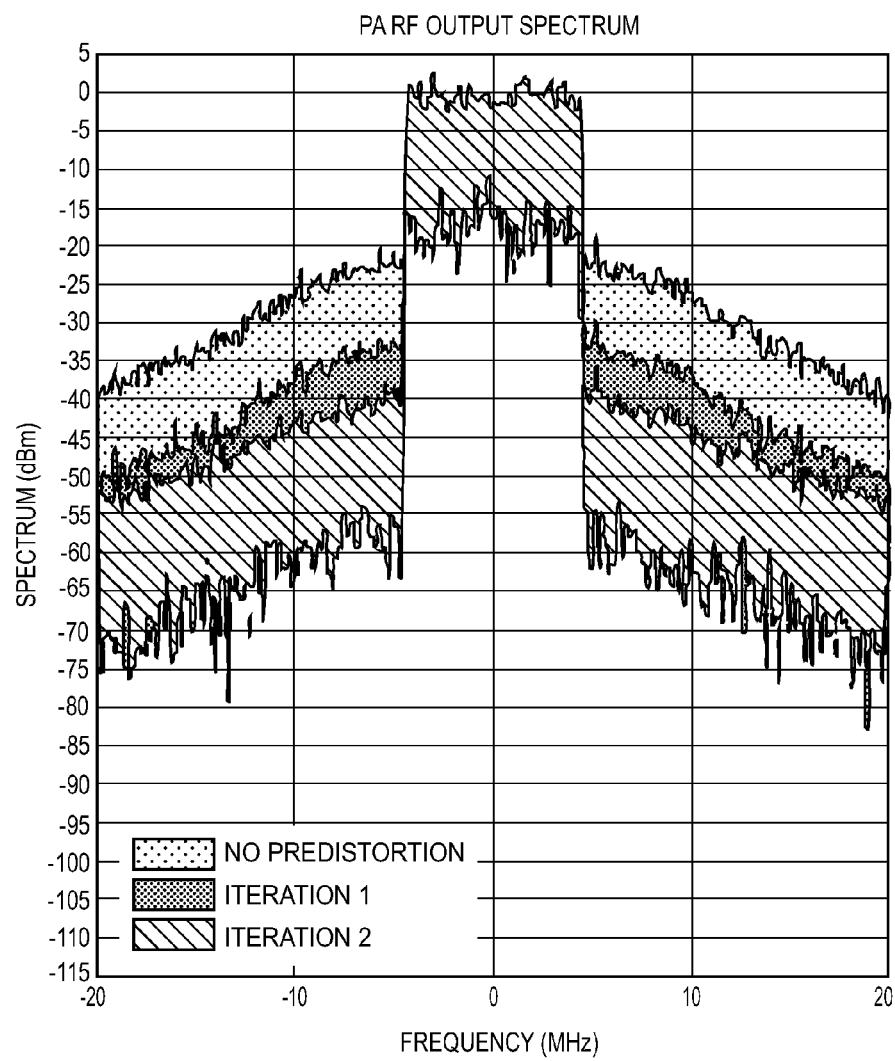
FIG. 14 is a graph depicting the output spectrum of the RF PA over several iterations of the adaptive ISO-Gain method of FIG. 10.

FIG. 14 depicts the output spectrum of the RF PA 16 without, and with one and two iterations of, the feedback-based, pre-distortion envelope tracking power control algorithm disclosed herein. Application of the algorithm reduces spectral emissions outside of the 10 MHz band centred on the carrier frequency (indicated as 0 MHz in FIG. 14 due to the simulator normalizing the spectrum frequency). The improvement is detailed in Table 1 below.

TABLE 1

Step by Step ACPRs

| Pre-distortion Iterations | Output Power (dBm) | E UTRA ACPR (dBc) | | UTRA 5 MHz ACPR1 (dBc) | | UTRA 5 MHz ACPR2 (dBc) | |
|---|---|---|---|---|---|---|---|
| | | High | Low | High | Low | High | Low |
| None | 26.6 | −26.9 | −26.5 | −27.7 | −27.8 | −31.9 | −31.6 |
| One | 26.4 | −38.1 | −37.7 | −38.9 | −38.9 | −43.3 | −42.9 |
| Two | 26.2 | −43.6 | −46.2 | −44.8 | −44.7 | −48.4 | −48.1 |

Embodiments of the present invention present numerous advantages over prior art envelope tracking pre-distortion methods. By using feedback of the actual amplified signal, the methods disclosed herein can compensate for nonlinearities in the entire transmitter 20 chain, not just the RF PA 16. Although described herein as benefitting the gain of the RF PA 16, the adaptive ISO-Gain envelope tracking additionally improves phase response of the RF PA 16. The method allows modifications to the pre-distortion applied to the supply power $V_{CC}(t)$ as necessary, such as when the transmitter 20 power or frequency changes, or as components age. The transmitter 20 is thus not reliant on factory calibrations, the elimination of which speeds and simplifies the manufacturing process. The pre-distortion calculations are not computationally intensive, incur little power consumption, and the calculated coefficients are stored in a very small, efficient LUT. Up to 17 dB improvement on ACPRs can be achieved with a $5^{th}$ order polynomial.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. An adaptive method of pre-distorting an envelope tracking modulation of supply voltage for a Radio Frequency (RF) power amplifier (PA), comprising:
   calculating the amplitude envelope of a complex baseband transmission signal; frequency up-converting the complex baseband transmission signal to RF;
   modulating a supply voltage, output by a dynamic power supply to a RF PA, in response to the amplitude envelope of the baseband transmission signal;
   amplifying the RF transmission signal by the RF PA receiving the modulated supply voltage;
   sampling an RF feedback signal at the RF PA output, frequency down-converting the RF feedback signal to baseband and extracting an amplitude envelope of the baseband feedback signal;
   comparing the amplitude envelope of the baseband feedback signal with the amplitude envelope of the baseband transmission signal; and
   pre-distorting the modulation of the supply voltage in response to the comparison so as to achieve a constant gain in the RF PA, the pre-distorting being performed by executing:
   a Learning Sequence comprising sampling the baseband feedback signal amplitude envelope at a plurality of predetermined interpolation nodes,
   an Interpolation Sequence comprising generating a nonlinear polynomial function to fit the sampled interpolation node values, and
   a Computation Sequence comprising multiplying the baseband transmission signal amplitude envelope by the nonlinear polynomial function.

2. The method of claim 1, wherein the polynomial is derived from Newton's algorithm.

3. The method of claim 1,
   wherein the Learning and Interpolation Sequences are performed periodically or at
   triggering events and coefficients to the nonlinear polynomial are stored; and wherein the Computation Sequence is performed on an ongoing basis to pre-distort the modulation of the supply voltage so as to achieve a constant gain in the RF PA.

4. The method of claim 1, wherein the Learning Sequence further comprises generating a table of supply voltage values and corresponding baseband feedback signal amplitude envelope values at predefined interpolation nodes.

5. The method of claim 4, wherein the Interpolation Sequence further comprises:
   calculating a plurality of RF PA gain values, each comprising a baseband feedback signal amplitude envelope value divided by a supply voltage level corresponding to baseband transmission signal amplitude envelope value; and
   calculating the coefficients of a polynomial derived from the calculated RF PA gain values and the supply voltage levels.

6. A Radio Frequency (RF) transmitter, comprising:
   a signal generator operative to generate a complex baseband transmission signal; frequency up-converting mixers operative to up-convert the baseband transmission signal to RF;
   an RF Power Amplifier (PA) operative to amplify the RF transmission signal;
   a dynamic power supply operative to provide a supply voltage to the RF PA that is modulated to track an amplitude envelope of the baseband transmission signal;
   a feedback loop operative to sample an RF feedback signal at the RF PA output and
   frequency down-convert the RF feedback signal to baseband; and
   a pre-distortion circuit operative to calculate the gain of the RF PA based on the baseband feedback signal and the baseband transmission signal, and further operative to control the power supply to pre-distort the modulated supply voltage so as to achieve a constant gain in the RF PA, by executing:
   a Learning Sequence comprising sampling the baseband feedback signal amplitude envelope at a plurality of predetermined interpolation nodes,
   an Interpolation Sequence comprising generating a nonlinear polynomial function to fit the sampled interpolation node values, and a Computation Sequence comprising multiplying the baseband transmission signal amplitude envelope by the nonlinear polynomial function.

7. The transmitter of claim 6 wherein the feedback loop comprises:
an attenuator operative to attenuate the sampled RF feedback signal;
frequency down-converting mixers operative to down-convert the RF feedback signal to baseband; and
an extraction circuit operative to calculate the amplitude envelope of the baseband feedback signal.

8. The transmitter of claim 6, wherein the polynomial is derived from Newton's algorithm.

9. The transmitter of claim 6, wherein the pre-distortion circuit is operative to execute the Learning and Interpolation Sequences in response to a triggering event and to store parameters for the nonlinear polynomial, and is operative to execute the Computation Sequence on an ongoing basis to pre-distort the modulation of the supply voltage so as to achieve a constant gain in the RF PA.

10. The transmitter of claim 6, wherein when executing the Learning Sequence, the pre-distortion circuit is further operative to generate a table of supply voltage values and corresponding baseband transmission signal amplitude envelope values at predefined interpolation nodes.

11. The transmitter of claim 10, wherein when executing the Interpolation Sequence, the pre-distortion circuit is further operative to:
calculate a plurality of RF PA gain values, each comprising a baseband feedback signal amplitude envelope value divided by a supply voltage level corresponding to a baseband transmission signal amplitude envelope value; and
calculate the coefficients of a polynomial derived from the calculated RF PA gain values and the supply voltage levels.

12. A non-transient computer readable media storing program instructions operative to pre-distort an envelope tracking modulation of supply voltage for a Radio Frequency (RF) power amplifier (PA), the program instructions operative to cause a controller to:
calculate the amplitude envelope of a complex baseband transmission signal;
modulate a supply voltage, output by a dynamic power supply to a RF PA, in response to the amplitude envelope of the baseband transmission signal;
extract an amplitude envelope of a baseband feedback signal sampled at the RF PA output and frequency down-converted;
calculate the RF PA gain from the amplitude envelope of the baseband feedback signal and the amplitude envelope of the baseband transmission signal; and
pre-distort the modulation of the supply voltage in response to the calculated gain so as to achieve a constant gain in the RF PA by executing:
a Learning Sequence comprising sampling the baseband feedback signal amplitude envelope at a plurality of predetermined interpolation nodes,
an Interpolation Sequence comprising generating a nonlinear polynomial function to fit the sampled interpolation node values, and
a Computation Sequence comprising multiplying the baseband transmission signal amplitude envelope by the nonlinear polynomial function.

* * * * *